US 6,649,476 B2
Nov. 18, 2003

(12) United States Patent
Forbes

(54) MONOTONIC DYNAMIC-STATIC PSEUDO-NMOS LOGIC CIRCUIT AND METHOD OF FORMING A LOGIC GATE ARRAY

(75) Inventor: Leonard Forbes, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 09/788,109

(22) Filed: Feb. 15, 2001

(65) Prior Publication Data

US 2002/0110032 A1 Aug. 15, 2002

(51) Int. Cl.⁷ .............................................. H01L 21/336
(52) U.S. Cl. ..................... 438/268; 438/201; 257/302; 257/315; 257/334
(58) Field of Search ................................. 438/201, 268; 257/334, 302, 315

(56) References Cited

U.S. PATENT DOCUMENTS

| | | | |
|---|---|---|---|
| 4,569,032 A | 2/1986 | Lee | 364/787 |
| 4,797,580 A | 1/1989 | Sunter | 307/451 |
| 5,525,916 A | 6/1996 | Gu et al. | 326/98 |
| 5,550,487 A | 8/1996 | Lyon | 326/33 |
| 5,691,230 A | 11/1997 | Forbes | 437/62 |
| 5,796,282 A | 8/1998 | Sprague et al. | 327/210 |
| 5,798,938 A | 8/1998 | Heikes et al. | 364/490 |
| 5,828,234 A | 10/1998 | Sprague | 326/98 |
| 5,867,036 A | 2/1999 | Rajsuman | 326/16 |
| 5,942,917 A | 8/1999 | Chappell et al. | 326/121 |
| 5,973,514 A | 10/1999 | Kuo et al. | 326/98 |
| 5,977,579 A * | 11/1999 | Noble | 257/302 |
| 6,072,209 A | 6/2000 | Noble et al. | 257/296 |
| 6,077,745 A * | 6/2000 | Burns, Jr. et al. | 438/270 |
| 6,107,835 A | 8/2000 | Blomgren et al. | 326/98 |
| 6,108,805 A | 8/2000 | Rajsuman | 714/724 |
| 6,150,687 A * | 11/2000 | Noble et al. | 257/302 |
| 6,399,979 B1 | 6/2002 | Noble et al. | 257/302 |
| 6,406,962 B1 * | 6/2002 | Agnello et al. | 438/268 |
| 6,448,601 B1 | 9/2002 | Forbes et al. | 257/302 |
| 6,496,034 B2 | 12/2002 | Forbes et al. | 326/41 |
| 2002/0109173 A1 | 8/2002 | Forbes et al. | 257/300 |
| 2003/0025712 A1 | 2/2003 | Corr | 345/606 |

FOREIGN PATENT DOCUMENTS

EP     0 082 773 A2     12/1982

OTHER PUBLICATIONS

T. Thorp. G. Yee and C. Sechen, "Monotonic Static CMOS and Dual VT Technology", Sym. Low Power Electronics and Design, San Diego, 16–17 Aug. 1999, pp 151–155.

T. Thorp, G. Yee, and C. Sechen, "Domino logic synthesis using complex static gates," IEEE/ACM Int. Conf. On Computer–Aided Design, pp. 1. 1998.

P. Kalavade et al, A Novel Sub–10nm Transistor, IEEE Device Research Conf., Denver, Co, Jun. 2000, pp. 71–72.

P. Xuan et al., *60nm Planarized Ultra–thin Body Solid Phase Epitaxy MOSFETs*, IEEE Device Research Conf., Denver, Co, Jun. 2000, pp. 67–68.

Bernstein, Kerry, et al., "High–Speed Design Styles Leverage IBM Technology Prowess", 6 pages (Aug. 22, 1999).

Hergenrother, J.M., et al., "The Vertical Replacement–Gate (VRG) MOSFET: A 50–nm Vertical MOSFET with Lithography–Independent Gate Length", *IEEE#0–7803–5413*, 4 pages (Mar. 1999).

* cited by examiner

*Primary Examiner*—Michael S. Lebentritt
*Assistant Examiner*—Pho Luu
(74) *Attorney, Agent, or Firm*—Wells St. John P.S.

(57) ABSTRACT

A monotonic dynamic-static pseudo-NMOS logic circuit comprises a dynamic logic circuit having a clock input and having an output configured to be pre-charged high when a low clock signal is provided to the clock input; and a static logic circuit having a clock bar input and having an output configured to be precharged low when a high value of the complement of the clock signal is provided to the clock bar input. A logic gate array comprises a plurality of vertical ultrathin transistors coupled together.

11 Claims, 10 Drawing Sheets

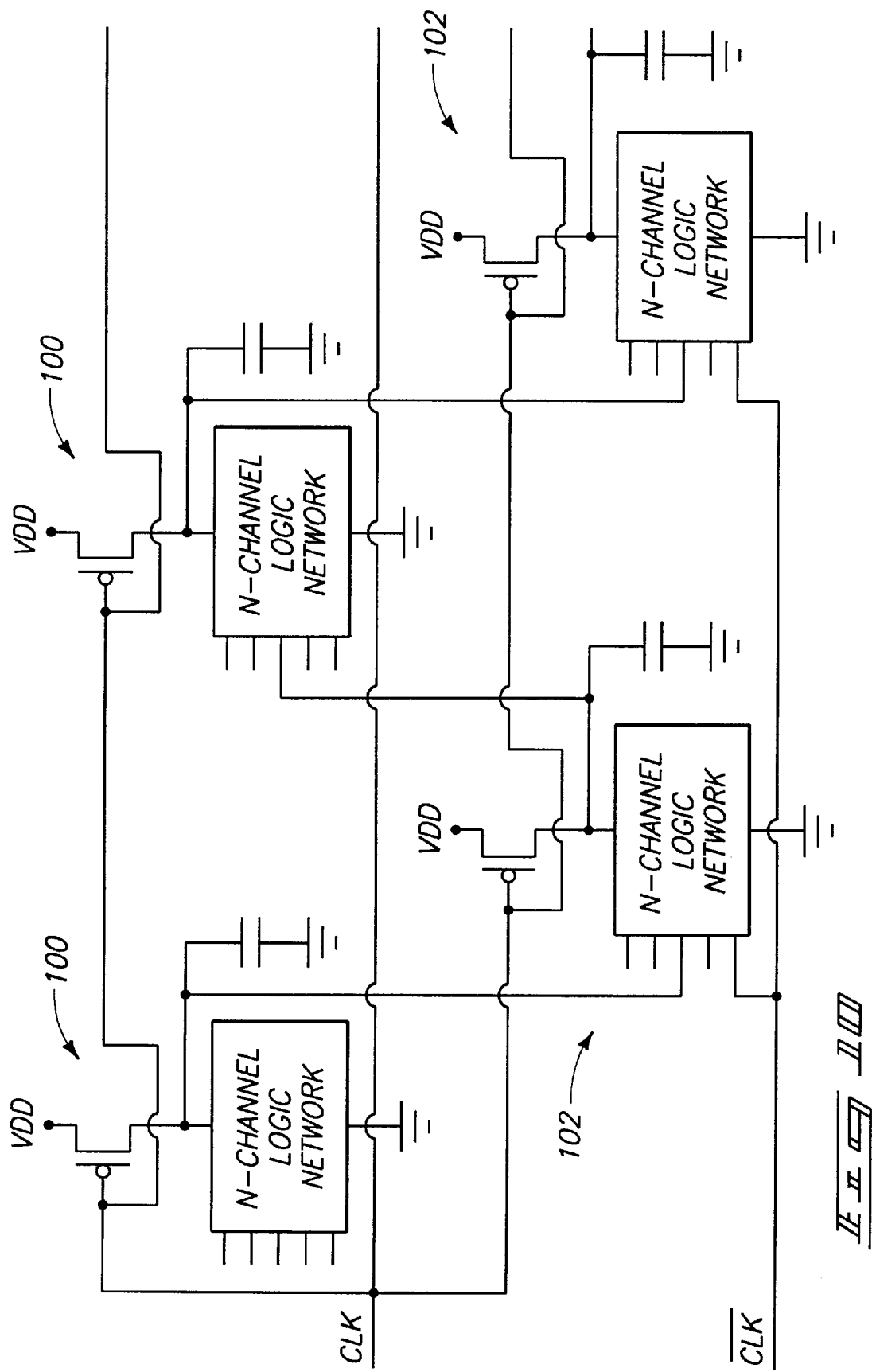

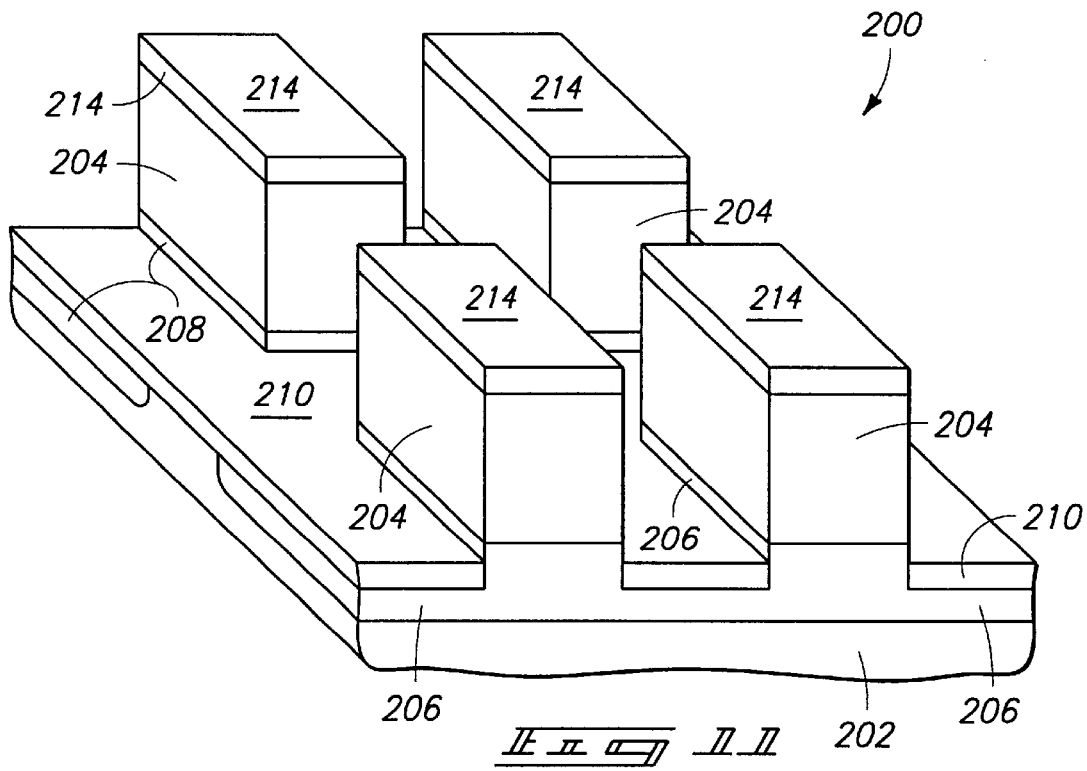
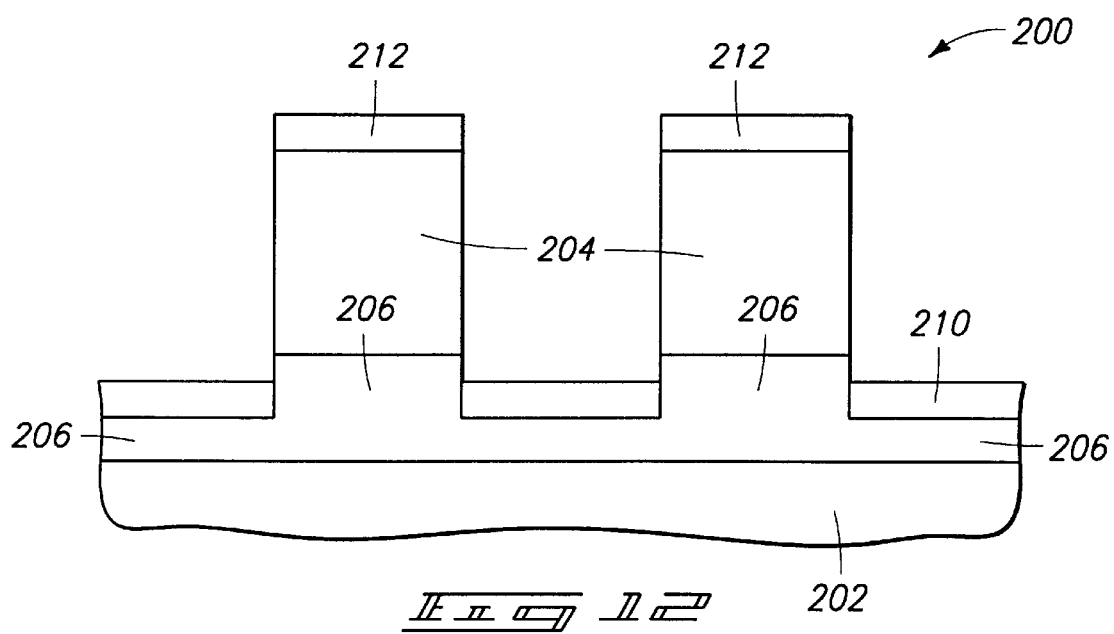

MONOTONIC DYNAMIC-STATIC PSEUDO-NMOS LOGIC CIRCUIT AND METHOD OF FORMING A LOGIC GATE ARRAY

TECHNICAL FIELD

The invention relates to CMOS gate arrays. The invention also relates to vertical ultrathin body transistors. The invention further relates to monotonic dynamic-static pseudo-NMOS logic circuits.

BACKGROUND OF THE INVENTION

CMOS technology is used for digital integrated circuits due to low power dissipation, high density of integration, and low cost of fabrication. CMOS technology is also used for analog integrated circuits.

Applications that use microelectronic components, such as telecommunications equipment, industrial control equipment, automotive electronics, etc., require more and more specialized integrated circuits. The continuing development in semiconductors has led to use of gate arrays and standard cells as a modern and inexpensive way to produce Application Specific Integrated Circuits (ASICs). An ASIC is an integrated circuit that can place on a single chip an entire system or a great part of it, performing not only digital, but also analog functions.

Gate arrays are used in ASIC design. A CMOS gate array can be described as a matrix of premanufactured (e.g., identical) cells that only requires the addition of the final metal and contact masks to define a new circuit function. Gate array technology can thus quickly respond to customer requirements in a low cost and efficient manner. Gate arrays can be implemented using a variety of circuit and process technologies including static CMOS and bipolar emitter coupled logic.

FIG. 1 shows a prior art static CMOS logic circuit 10. A problem with static CMOS logic circuits is that each input 12 and 14 must drive two gates, the gate of one NMOS transistor and the gate of a PMOS transistor. Input 12 drives gates 16 and 18, and input 14 drives gates 20 and 22. This results in a large area for static CMOS circuits and a large number of metal wiring levels must be utilized to allow interconnections.

Another problem with static CMOS logic circuits is that in the PMOS transistor the hole mobility is about three times lower than the mobility of electrons if the transistors have comparable sizes. Because of this, switching transients are very asymmetrical. The charge up transient of the capacitive load in a simple inverter takes far longer than the discharge transient. To attempt to compensate, the PMOS transistors are often fabricated with a large width or size to provide symmetrical switching. However, this increases the stray capacitive loads and results in an even larger area for the circuits, and very inefficient area utilization.

BRIEF DESCRIPTION OF THE DRAWINGS

Preferred embodiments of the invention are described below with reference to the following accompanying drawings.

FIG. 10 is a circuit schematic illustrating multiple circuits of the type shown in FIGS. 6 and 7 coupled together.

FIG. 11 is a perspective view of a semiconductor wafer illustrating steps in a process for manufacturing transistors for the circuits of FIG. 6 or FIG. 7.

FIG. 12 is a front elevational view of the wafer of FIG. 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention provides a monotonic dynamic-static pseudo-NMOS logic circuit. The monotonic dynamic-static pseudo-NMOS logic circuit includes a dynamic logic circuit having a clock input and having an output configured to be pre-charged high when a low clock signal is provided to the clock input. The monotonic dynamic-static pseudo-NMOS logic circuit further includes a static logic circuit having a clock bar input and having an output configured to be precharged low when a high value of the complement of the clock signal is provided to the clock bar input.

In one aspect of the invention, the static logic circuit has a logic input coupled to the output of the dynamic logic circuit. In another aspect of the invention, the dynamic logic circuit has a logic input coupled to the output of the static logic circuit.

In one aspect of the invention, the dynamic logic circuit includes a p-type transistor having a control electrode defining the clock input and has a channel extending between a voltage supply and the output of the dynamic logic circuit. The dynamic logic circuit further comprises logic circuitry, configured to define a logic function, coupled between a low voltage and the output configured to be precharged high.

In another aspect of the invention, the static logic circuit includes a p-type transistor having a control electrode defining the clock input and having a channel extending between a voltage supply and the output of the static logic circuit. The static logic circuit further comprises logic circuitry, configured to define a logic function, coupled between a low voltage and the output configured to be precharged low.

Another aspect of the invention provides a logic gate array comprising a plurality of vertical ultrathin transistors coupled together.

Figure 1:
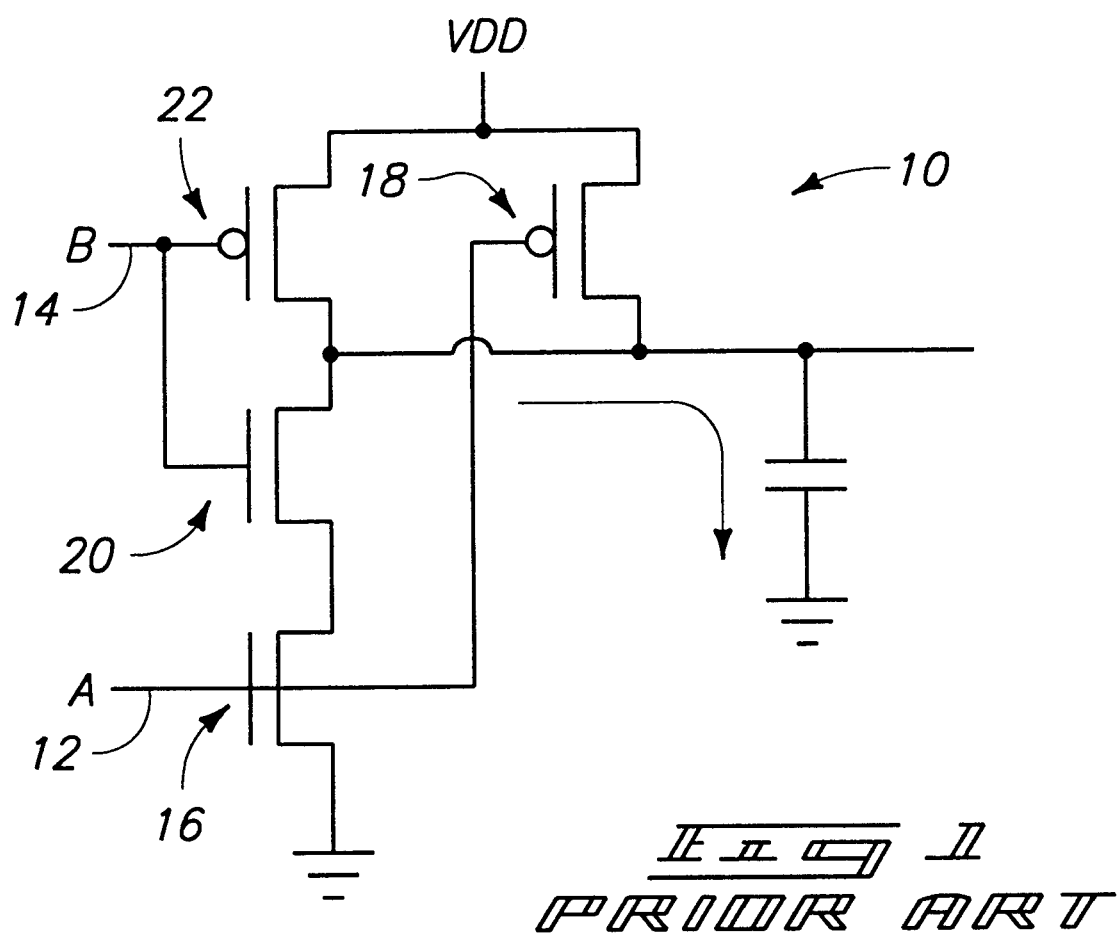
FIG. 1 is a circuit schematic showing a conventional static CMOS logic circuit.
Figure 2:
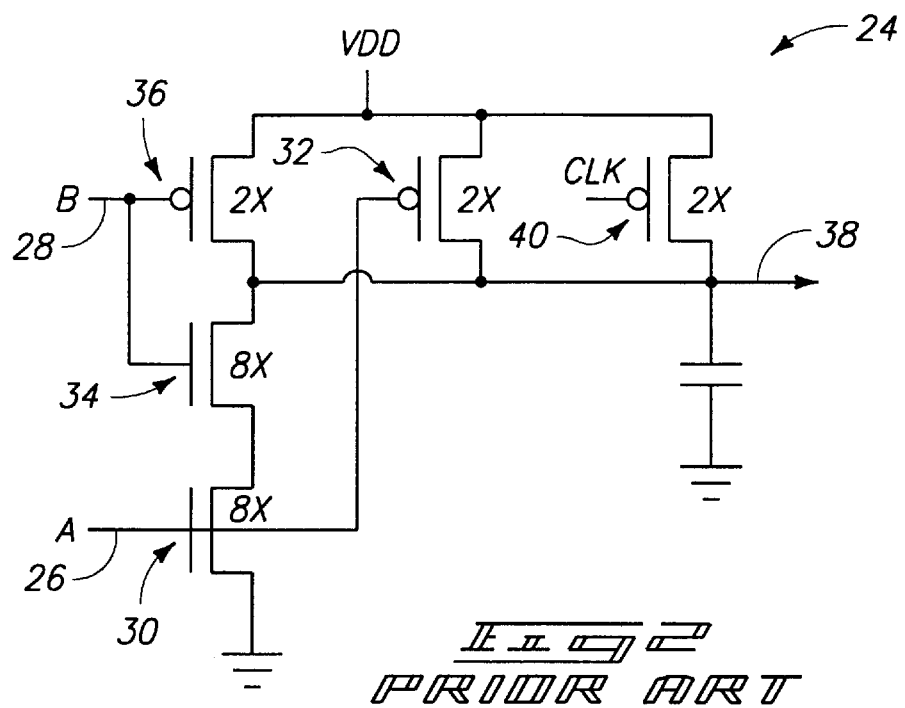
FIG. 2 is a circuit schematic showing a low skew NAND of monotonic CMOS logic circuit.
Figure 3:
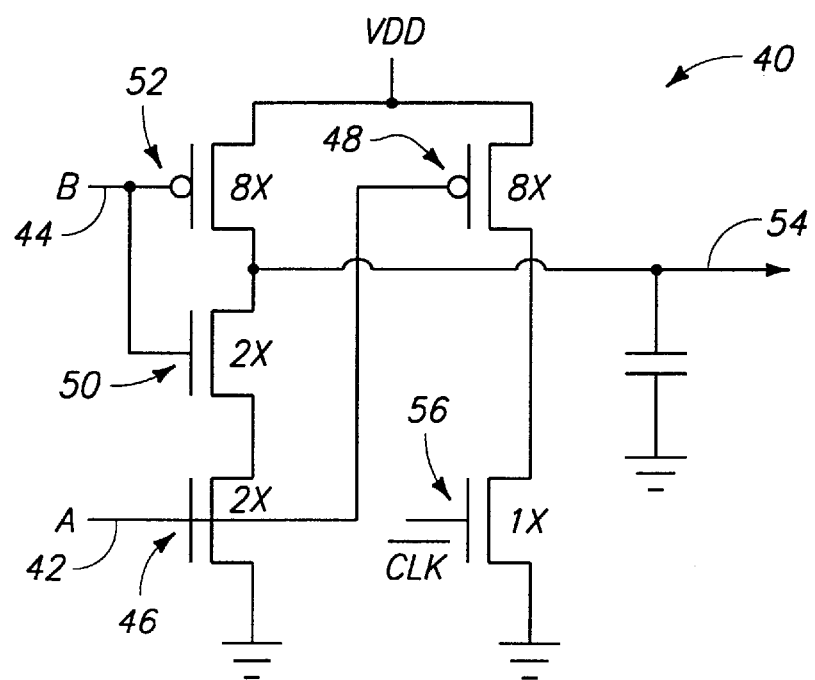
FIG. 3 is a circuit schematic showing a high skew NAND of the monotonic CMOS logic circuit.

FIGS. 2 and 3 show monotonic static CMOS logic circuits (logic gates) 24 and 40. The circuit 24 is a low skewed logic circuit having devices which are sized so that the logic circuit 24 has a fast fall delay at the expense of a slow rise delay. The circuit 40 is a high skewed logic circuit designed to provide a fast pull-up.

The circuit 24 has inputs 26 and 28. The input 26 drives gates 30 and 32 and the input 28 drives gates 34 and 36. The circuit 40 has inputs 42 and 44. The input 42 drives gates 46 and 48 and the input 44 drives gates 50 and 52. A clock input CLK is provided to a gate 40 of the circuit 24 and a complementary clock signal CLK BAR is provided to a gate 56 of the circuit 40. When CLK is low, the output of the logic circuit 24 is precharged to a logic 1 and the output of the logic circuit 40 is precharged to a logic 0. During the evaluation phase of CLK, the output of the logic circuit 24 with either switch from 1 to 0 or remain at the precharged value. Similarly, the output of the logic circuit 40 will either switch from 0 to 1 or remain at the precharged value. A path of monotonic static logic circuits must alternate with low skewed and high skewed logic circuits. A low skewed logic circuit drives a high skewed logic circuit and vice versa.

Monotonic static CMOS logic circuits are known in the art and are discussed, for example, in T. Thorp, G. Yee and C. Sechen, "Monotonic Static CMOS and Dual VT Technology," Int. Sym. Low Power Electronics and Design, San Diego, Aug. 16–17 1999, pp 151–155. In the circuit 24, the large charge up time through the PMOS devices is avoided by precharging output node 38 to VDD by the use of the clock, CLK. When the clock CLK is low, the PMOS transistor 40 will be on and the output load capacitance will be precharged to VDD. Similarly, in the complementary logic circuit 40 (FIG. 3), the complementary clock voltage CLK BAR will be high and the output 54 precharged to a low voltage or ground.

The outputs of the logic circuits are preset (precharged) high (for a pull-down circuit 24) or low (for a pull-up circuit 40), and hence the logic circuits either stay with that output value or switch to the other during evaluation. This is called monotonic behavior. For example, the only possible output transitions for a pull-down logic circuit are 0 to 0, 1 to 1, and 0 to 1. This is in contrast to regular static CMOS circuits, in which an output can perform any of the following transitions: 0-0, 1-1, 0-1, and 1-0. The logic circuits 24 and 40 are cascaded with one of the first type, then one of the second type, then one of the first type, etc.

More particularly, the logic circuit 24 is a low skew NAND. When CLK is low, logic circuit 24 is precharged high. Evaluation in circuit 24 takes place when CLK is high. The output 38 switches from 1 to 0 or remains. The logic circuit 40 is a high skew NAND. When CLK is low, CLK BAR is high, and circuit 40 is precharged low. Evaluation in circuit 40 takes place when CLK is high (CLK BAR is low). The output 54 switches from 0 to 1 or remains the same.

By an appropriate logic optimization of the inputs and arrangement of the circuits, the circuits can be placed so as to minimize signal delays through the circuit and minimize power consumption. This is possible because the circuit nodes are precharged prior to any of the input data becoming high and a monotonic logic evaluation of these inputs to the circuit. The sizes of the devices can be optimized to quickly discharge the charged nodes and quickly charge the discharged nodes. A 1.5 times speed improvement and a 1.5 times area reduction has been demonstrated over conventional static CMOS logic.

Figure 4:
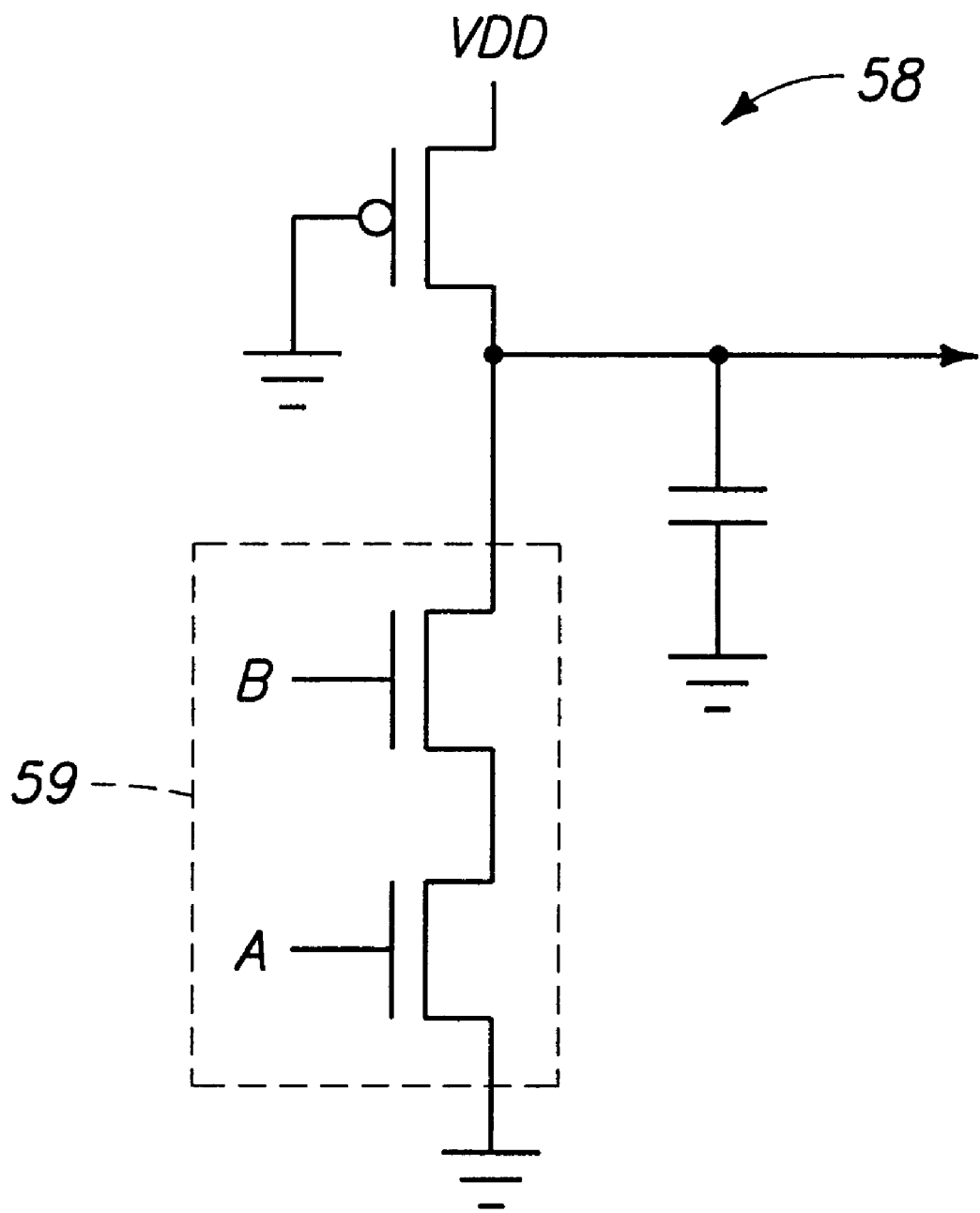
FIG. 4 is a circuit schematic of a pseudo-NMOS static logic circuit.

With respect to synthesis and logic optimization, attention is directed towards T. Thorp, G. Yee and C. Sechen, "Monotonic Static CMOS and Dual VT Technology," Int. Sym. Low Power Electronics and Design, San Diego, Aug. 16–17 1999, pp 151–155. That article indicates that monotonic logic is non-inverting and must be mapped to a network that does not contain intermediate inversions. The removal of intermediate inverters within a logic network can be accomplished by generating a unate representation for the network, which may require logic duplication because separate logic cones for both positive and negative signal phases may be needed. After a unate representation has been generated, the network can be mapped to monotonic static CMOS gates using, for example, a concurrent two-coloring and technology mapping algorithm to merge a unate network's non-inverting functions into an alternating pattern of low skew and high skew logic gates. See T. Thorp, G. Yee, and C. Sechen, "Domino logic synthesis using complex static gates," IEEE/ACM Int. Conf. On Computer-Aided Design, pp. 242–247, 1998. The following two-coloring and mapping algorithm is indicated by Yee and Sechen as being useful when it is desired that each low skew gate will have no pull-down path longer than a user specified limit and that each high skew gate will have non pull-up path longer than a user specified limit:

procedure
   while performing a postorder traversal of a network N
      from its outputs for all predecessors of current_node
      that are not multi-output nodes predecessor_node=
      current_node's predecessor with
      a) the greatest distance from a primary input and, to
         break ties,
      b) the fewest number of transistors in series; if merging
         predecessor_node and current_node satisfy node
         limits merge predecessor with current node;
      update node colors;
      resolve color conflicts;
end procedure FIG. 4 shows a pseudo NMOS static logic circuit 58. The circuit 58 shown in FIG. 4 includes circuitry 59 defining a logic function. While the circuitry 59 is used to define a two input NAND, different logic functions could be implemented. In a pseudo NMOS static logic circuit, the PMOS devices act as load devices, much like as depletion mode load devices in an enhancement-depletion NMOS static logic circuit. Although wiring complexity is significantly reduced, a difficulty is with static DC power consumption. Static DC power consumption can be avoided by using clocked sequential dynamic logic families like domino CMOS or NORA (no race) dynamic logic, or a combination of dynamic and static logic. Other circuit techniques include zipper CMOS and sequentially clocked or clock-delayed logic circuits.

Figure 5:
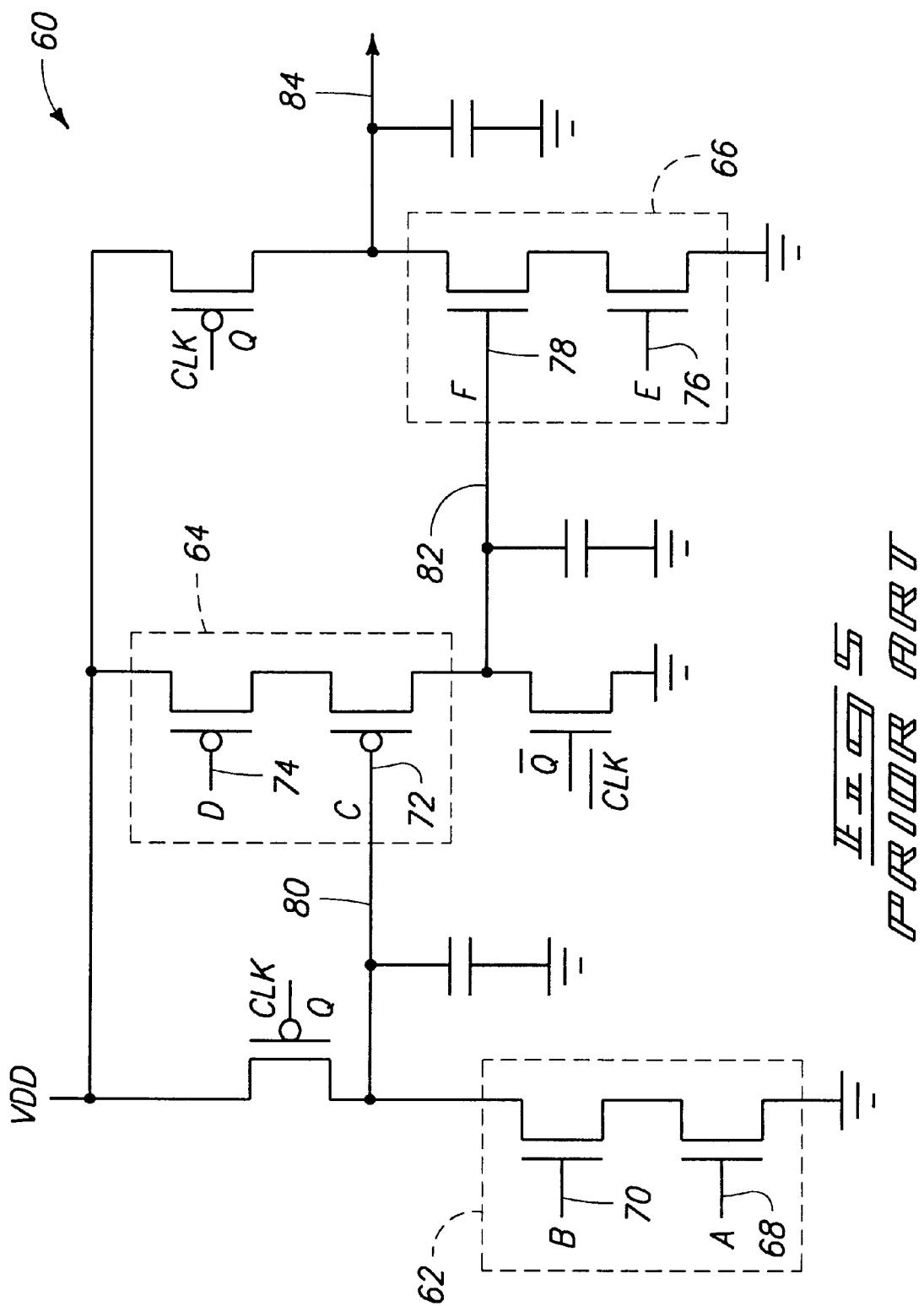
FIG. 5 is a circuit schematic of a zipper-CMOS logic circuit.

FIG. 5 shows a zipper CMOS logic circuit 60. The circuit 60 includes logic circuitry 62, 64, and 66 defining logic functions. The circuit 60 has inputs 68, 70, 72, 74, 76, and 78, and outputs 80, 82, and 84. In the zipper CMOS logic circuit 60, the precharge phase is when the clock CLK is low (the complement CLK BAR is high). Evaluation occurs when the clock, CLK, goes low. The signals and logic decisions propagate through a chain defined by logic circuitry 62, 64, and 66 like a mechanical zipper closing, hence the name zipper CMOS.

Zipper CMOS, pseudo NMOS, and domino logic circuits are described, for example, in the following U.S. patents, all of which are incorporated herein by reference: U.S. Pat. No. 6,108,805 to Rajsuman; U.S. Pat. No. 6,107,835 to Blomgren et al.; U.S. Pat. No. 5,973,514 to Kuo et al.; U.S. Pat. No. 5,942,917 to Chappell et al.; U.S. Pat. No. 5,828, 234 to Sprague; U.S. Pat. No. 5,867,036 to Rajsuman; U.S. Pat. No. 5,798,938 to Heikes et al.; U.S. Pat. No. 5,796,282 to Sprague et al.; U.S. Pat. No. 5,550,487 to Lyon; U.S. Pat. No. 5,525,916 to Gu et al.; U.S. Pat. No. 4,797,580 to Sunter; U.S. Pat. No. 4,569,032 to Lee.

Figure 6:
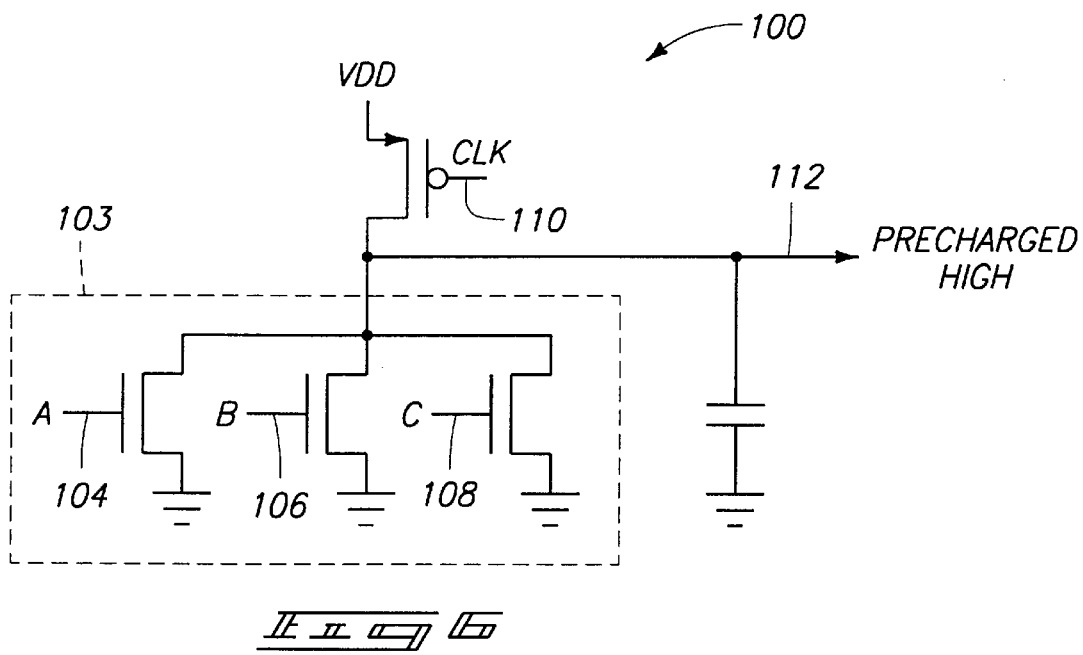
FIG. 6 is a circuit schematic showing a dynamic portion of monotonic dynamic-static pseudo-NMOS logic circuit.
Figure 7:
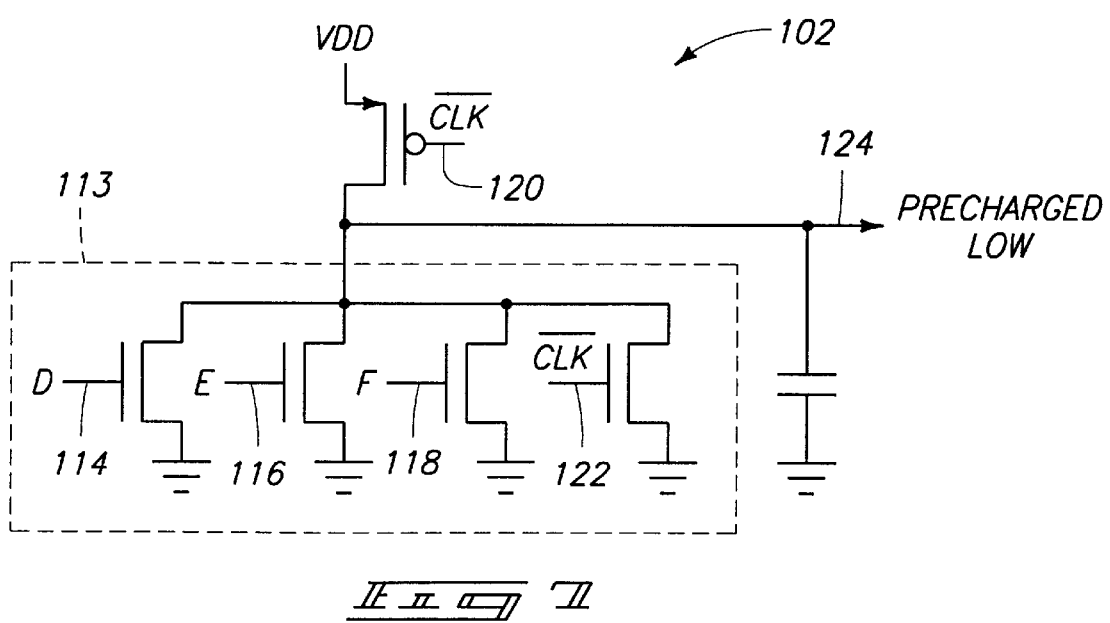
FIG. 7 is a circuit schematic showing a static portion of the monotonic dynamic-static pseudo-NMOS logic circuit.

FIGS. 6 and 7 show monotonic static CMOS logic circuits (or logic gates, cells, blocks, or stages) 100 and 102 in accordance with one aspect of the invention. The circuit 100 has logic circuitry 103. The illustrated logic circuitry 103 inputs 104, 106, and 108. Circuitry configured to perform any one of multiple possible logic functions could be substituted for the logic circuitry 103. The circuit 100 also includes a clock input 110 coupled to a source of a clock signal CLK, and an output 112. The circuit 100 is a dynamic circuit which is precharged high at the output 112. The circuit 100 is precharged high at the output 112.

The circuit 102 has logic circuitry 113. The illustrated logic circuitry 113 has inputs 114, 116, and 118. Circuitry configured to perform any one of multiple possible logic functions could be substituted for the logic circuitry 113. FIGS. 6 and 7 show three input NOR logic circuitry for circuitry 103 and 113, but other numbers of inputs or an inverter can be implemented by using a different number of transistors in circuitry 103 and 113. The circuit 102 also includes a clock input 120 coupled to the source of the clock signal CLK of FIG. 6, an input 122 coupled to the complement (CLK BAR) of the clock signal CLK of FIG. 6, and an output 124. The circuit 102 is precharged low at the output 124.

Figure 8B:
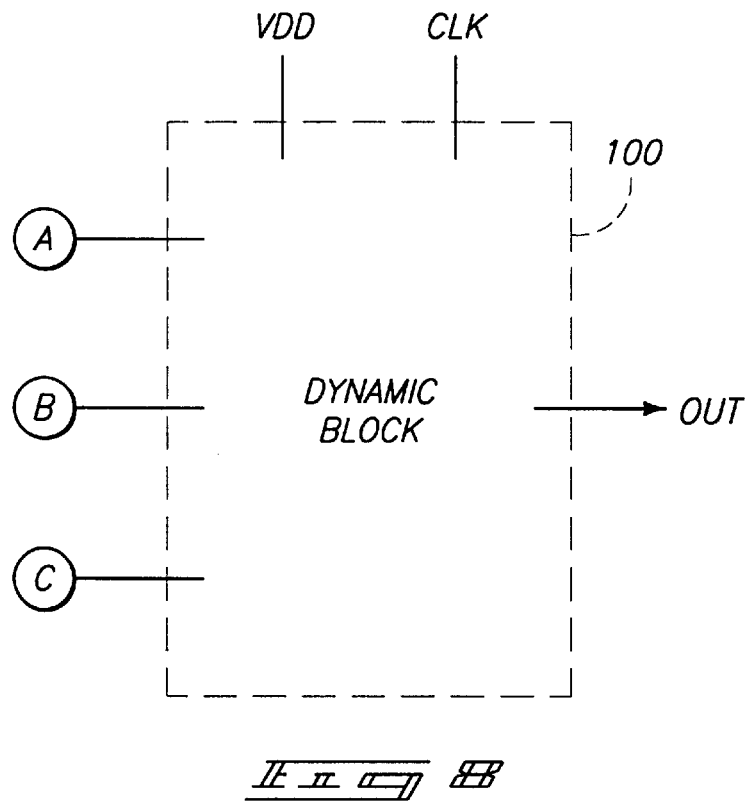
FIG. 8 is a block diagram representation of the circuit of FIG. 6.
Figure 9:
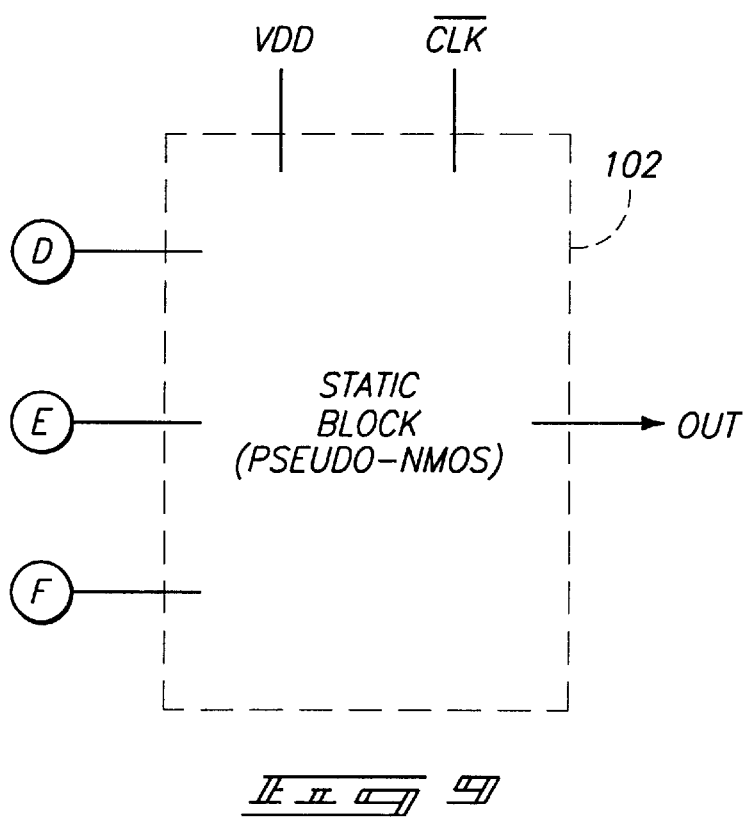
FIG. 9 is a block diagram representation of the circuit of FIG. 7.

FIGS. 8 and 9 are simplified block diagram representations of the circuits 100 and 102, respectively.

Circuits such as the circuits 100 and 102 are configured to be coupled together in sequence in an alternating fashion; e.g., one high precharge circuit (e.g., circuit 100), one low precharge circuit (e.g., 102), one high precharge circuit, one low precharge circuit, and so on (see, e.g., FIG. 10). The circuits 100 and 102 are precharged when the clock CLK is low (the complement CLK BAR is high). Following the precharge, some or all of the inputs 104, 106, 108, 114, 116, 118, 122 can change state and monotonic evaluation of the input will be performed by the logic circuits 100 and 102.

The outputs 112 and 124 of the logic circuits are preset (precharged) high for pull-down circuits (e.g. 100) and preset (precharged) low for pull-up circuits (e.g. 102). Therefore the logic circuits 100 and 102 either retain that output value (0 or 1) or switch to the other value during evaluation. This is monotonic behavior. Because the first stage is dynamic and the next stage is static during the evaluation phase, a circuit family including circuits 100 and 102 is most appropriately referred to as a monotonic dynamic-static pseudo-NMOS.

As is the case with monotonic static CMOS logic, the inputs and arrangement of the circuits 100 and 102 can be arranged to minimize signal delays through the circuit, and to minimize power consumption, using synthesis techniques known in the art and described, for example, in T. Thorp, G. Yee and C. Sechen, "*Monotonic Static CMOS and Dual VT Technology,*" Int. Sym. Low Power Electronics and Design, San Diego, Aug. 16–17 1999, pp 151–155 (see above). This is possible because the circuit nodes are precharged prior to any of the input data becoming high and prior to a monotonic logic evaluation of these inputs to the circuit. In one embodiment, the device sizes are optimized to quickly discharge the charged nodes and quickly charge the discharged nodes.

In a monotonic dynamic-static pseudo-NMOS including circuits 100 and 102, the second stage is static during the evaluation phase and uses NMOS devices for the evaluation. This is in contrast, for example, to zipper-CMOS where PMOS devices are used in the second stage. The use of NMOS devices in applicant's monotonic dynamic-static pseudo-NMOS results in a faster switching speed, though at the expense of some DC power dissipation. The monotonic dynamic-static pseudo-NMOS including circuits 100 and 102 uses far fewer devices, much less area, and much less wiring than domino static-CMOS logic configurations.

While full rail CMOS voltages, such as 5 volts and ground, could be used to define the high and low voltages, in other embodiments, different voltages are used as will be readily apparent to one of ordinary skill in the art. For example, 4 volts and 1 volts could be used to define the high and low voltages, respectfully; anything above a certain threshold could be considered high and anything below a certain threshold could be considered low, or a negative voltage could be used for the low voltage or for both the high and low voltages. As long as the high and low voltages can be distinguished from one another with sufficient reliability for the specific application, any voltages can be used to define the high and low voltages.

Process Technology Embodiments

The continuous scaling of MOSFET technology to reduce channel lengths to, for example, the deep sub-micron region where channel lengths are less than 0.1 micron, 100 nm, or 1000A causes significant problems in the conventional transistor structures. Junction depths should be much less than the channel length. This implies junction depths of a few hundred Angstroms for channel lengths of 1000 Angstroms. Such shallow junctions are difficult to form by conventional implantation and diffusion techniques. Extremely high levels of channel doping are required to suppress short-channel effects such as drain induced barrier lowering, threshold voltage roll off, and sub-threshold conduction. Sub-threshold conduction is particularly problematic in dynamic circuits technology because it reduces the charge storage retention time on capacitor nodes. These extremely high doping levels result in increased leakage and reduced carrier mobility. Therefore, the improved performance by making the channel shorter is negated by lower carrier mobility.

What is required, then, are transistors with ultra-thin bodies, or transistors where the surface space charge region scales down as other transistor dimensions scale down. Raising or burying the source/drain contact regions above or below the channel allows contacts to be made by conventional techniques.

In the embodiment shown in FIGS. 11–12, a silicon semiconductor substrate 202 is first provided. The substrate 202 can be any of three different types of substrates:

(i) lightly doped p-type;

(ii) conventional commercial silicon on insulator substrates (e.g. SIMOX); or (iii) islands of silicon on insulator formed by techniques such as those described in U.S. Pat. No. 5,691,230 to Forbes, incorporated herein by reference.

SIMOX (Separation by IMplanted Oxygen) involves implanting a high dose of oxygen ions at a sufficiently deep level within a silicon substrate. A subsequent anneal step forms a buried oxide layer in the substrate. After the anneal step, an additional layer of epitaxial silicon is usually deposited to obtain a sufficiently thick silicon layer on which to form a device.

A substrate of islands of silicon on insulator can be formed, for example, by directionally etching a silicon substrate, to form a plurality of trenches between protruding silicon rows; forming a silicon nitride cap on the silicon rows, extending partway down the sides of the trenches; isotropically etching the trenches, to partially undercut the silicon rows; and oxidizing the substrate, to fully undercut the silicon rows.

In the embodiment shown in FIGS. 11–15, the substrate 202 is of p-type material.

An ultrathin body transistor 200 is fabricated by oxidizing the silicon semiconductor substrate 202, and then etching pillars of oxide 204 into the substrate 202. The oxidized wafers previously had a layer of doped polysilicon deposited on the oxide. Layers of oxide and silicon nitride are deposited to act as an etch mask for forming the pillars and later as a CMP etch stop. In the embodiment shown in FIGS. 11 and 12, layer 206 is formed of n+ material, layer 208 is formed of p+ material. Layers 206 and 208 can be formed on the substrate, for example, by ion implantation or epitaxial growth. Layer 210 is oxide. Upper layers 212 are formed of n+ material, and upper layers 214 are formed of p+ material. These process steps are described in greater detail in U.S. Pat. Nos. 6,072,209 and 6,150,687 to Noble et al., both of which are incorporated herein by reference.

Figure 13:
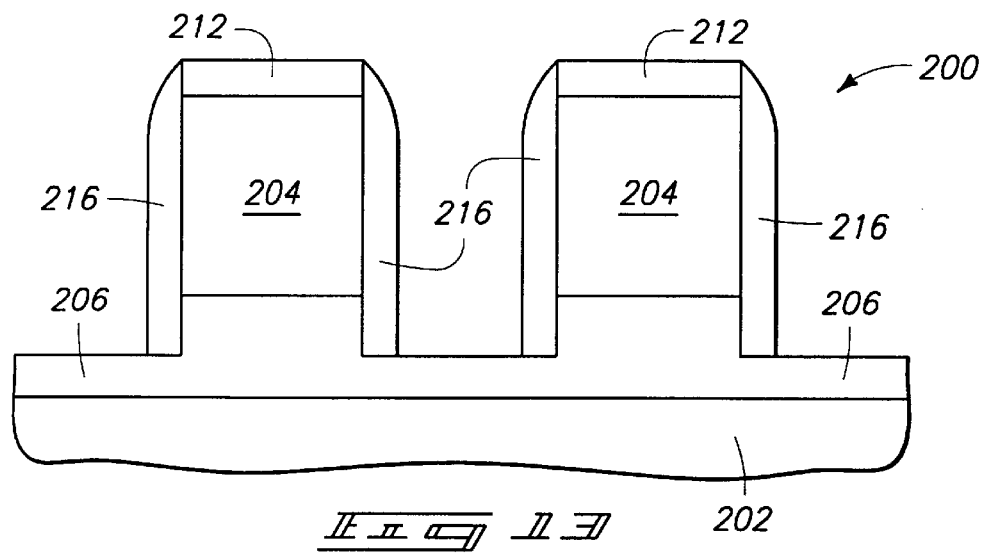
FIG. 13 is a front elevational view of the wafer of FIG. 12 after a subsequent processing step.
Figure 14:
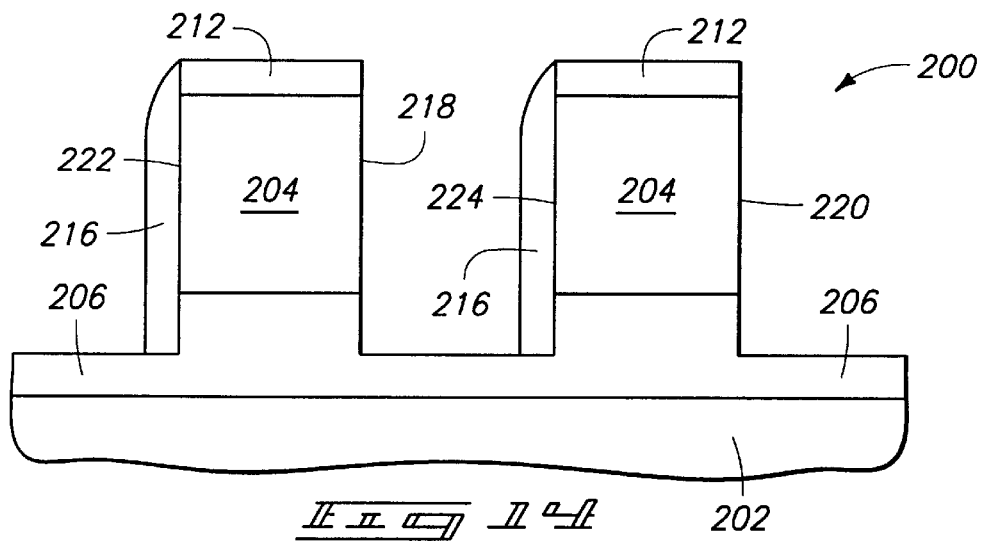
FIG. 14 is a front elevational view of the wafer of FIG. 13 after a subsequent processing step.
Figure 15:
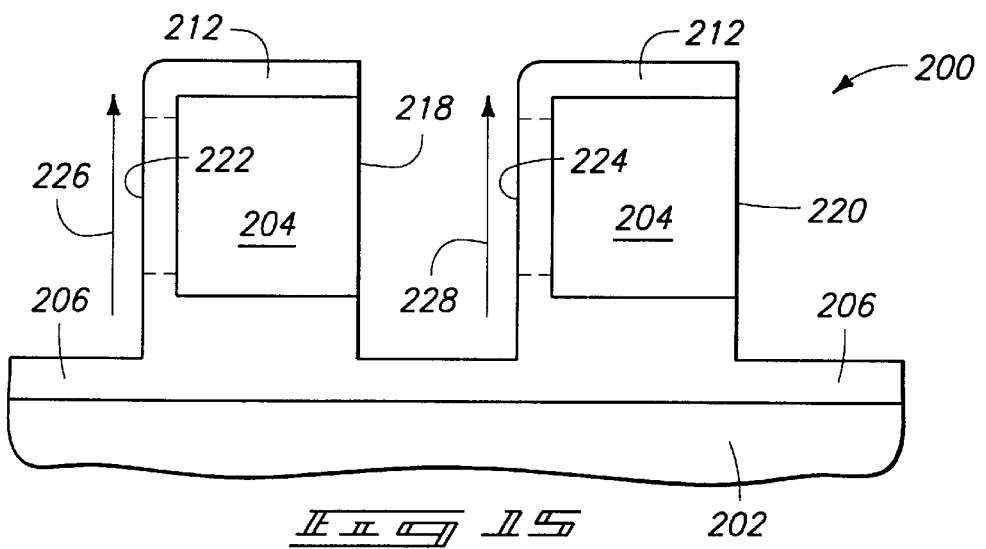
FIG. 15 is a front elevational view of the wafer of FIG. 14 after a subsequent processing step.

As shown in FIGS. 13–15, transistors with ultra-thin bodies are formed along side of respective oxide pillars 204. In FIG. 13, polysilicon 216 is deposited over the silicon pillars 204 and directionally etched to leave the lightly doped p-type material on the sidewalls of the pillars.

At this point, another masking step can be employed (see FIG. 14) to isotropically etch the polysilicon 216 off of some of the sidewalls 218 and 220 and leave polysilicon only on one sidewall 222 and 224 of each pillar as required for particular configurations.

Then, (see FIG. 15) the wafer is heated at about 550° C. to about 700° C. and the polysilicon will recrystallize and lateral epitaxial solid phase regrowth will occur vertically as indicated by arrows 226 and 228. The crystalline silicon at the bottom will seed this crystal growth and an ultrathin crystalline film will form on each pillar 204 that can be used as the channel of a MOSFET transistor. If the film is only on one side 222 of the pillar 204, the crystallization will proceed vertically and into the n+ polysilicon contact material 212 on top of the pillar 204. If both sides of the pillar are covered, the crystallization will leave a grain boundary near the center on top of the pillar 204.

These techniques are similar, in part, to techniques described (in connection with different applications) in P Xuan et al., 60 *nm Planarized Ultra-thin Body Solid Phase Epitaxy MOSFETs*, IEEE Device Research Conf., Denver, Colo., June 2000, pp. 67–68, and in P. Kalavade et al, *A Novel Sub-10 nm Transistor*, IEEE Device Research Conf., Denver, Colo., June 2000, pp. 71–77.

The drain and source regions of a transistor are in the crystalline material along the sidewall of each pillar 204. A gate insulator is grown or deposited on this thin film and either a horizontal or vertical gate structure is formed in the trench beside the pillar 204. Horizontal gate structures for use with vertical pillar transistors are described, for example in incorporated U.S. Pat. No. 6,150,687 to Noble et al. or in U.S. patent application Ser. No. 09/596,266 filed Jun. 16, 2000 naming as inventors Noble, Forbes, and Ahn, and incorporated herein by reference. The different gate structures used in alternative embodiments are therefore:

(i) horizontal gate structures of deposited polisilicon, as described in U.S. Pat. No. 6,150,687 to Noble et al.;
(ii) horizontal replacement gate structures, a variation on U.S. Pat. No. 6,150,687, described in U.S. patent application Ser. No. 09/596,266 filed Jun. 16, 2000; and
(iii) vertical gate structures as described in U.S. Pat. No. 6,072,209 to Noble et al.

Figure 16:
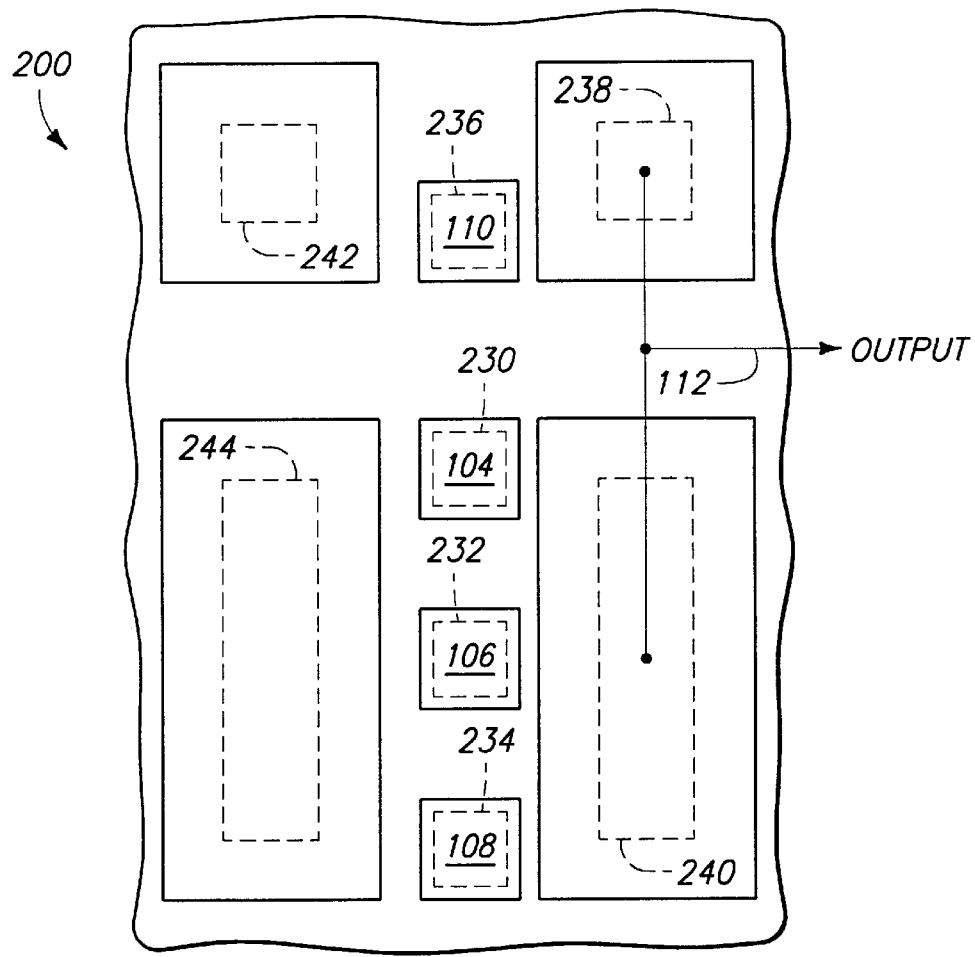
FIG. 16 is a top plan view of a wafer after a step subsequent to a step such as the one illustrated in FIG. 15.
Figure 17:
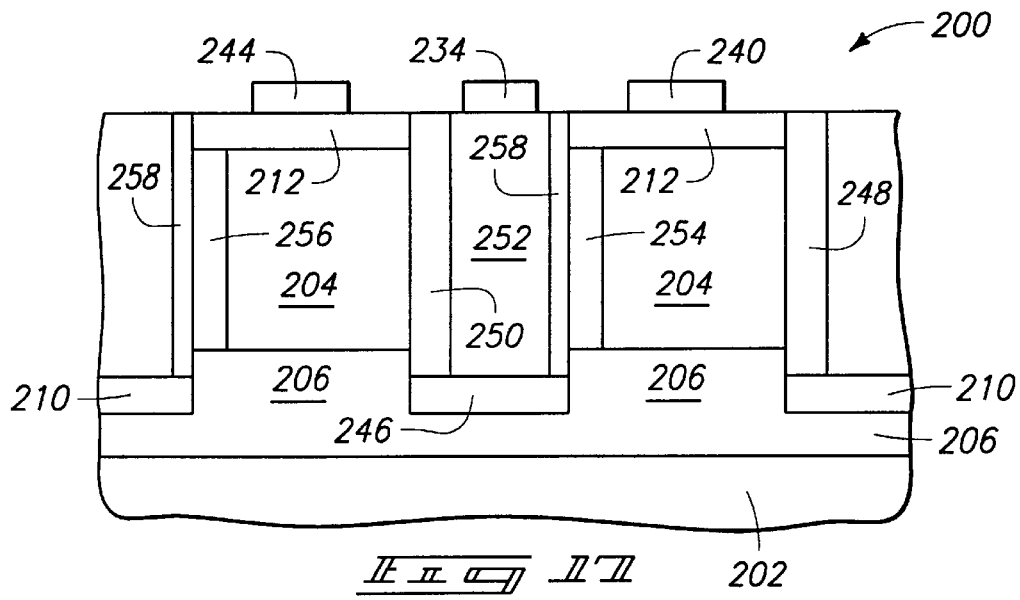
FIG. 17 is a front elevational view of the wafer of FIG. 16.

FIGS. 16 and 17 illustrate the implementation of a logic gate using vertical devices. The logic gate implemented in FIGS. 16 and 17 is a dynamic three-input NOR gate, similar to the circuit 100 of FIG. 6 (except without the capacitor being specifically illustrated). However, it will be readily apparent that any logic gate can be implemented using vertical devices.

The configuration shown in FIG. 16 includes contacts 230, 232, 234, and 236 defining inputs 104 (or A), 106 (or B), 108 (or C), and 110 (or CLK), respectively of FIG. 6. Contacts 238 and 240 are coupled together to define the output 112. Contacts 242 and 244 are also included.

The configuration shown in FIG. 17 includes oxide areas 204, 210, 246; thick oxide areas 248 and 250, n+ areas 206, and 212, an area 252 of poly, areas 254 and 256 of silicon, and gate oxide area 258.

One of the differences between the illustrated implementation and the incorporated prior patents and application is the thick oxide formed along side one of the vertical walls of a pillar 204. Another difference is the utilization of both PMOS and NMOS vertical devices in the array. Three different types of gate structures have been described, and these can be utilized on three different disclosed types of substrates to form the gate arrays.

Higher and higher density requirements in logic gates result in smaller and smaller dimensions of the structures and included transistors. Conventional planar transistor structures are difficult to scale to deep sub-micron sizes. Applicant has provided vertical transistors with ultrathin bodies in connection with logic gate arrays. The advantages of smaller dimensions for higher density and higher performance are both realized in logic gate arrays by employing vertical ultrathin transistors in logic gate arrays.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a logic gate array comprising:
providing a substrate having a generally planar working surface;
oxidizing the substrate;
forming a pillar of semiconductor material extending outwardly from the working surface of the substrate, the pillar having a plurality of sidewalls;
depositing polysilicon over the pillars;
directionally etching the deposited polysilicon;
heating to cause lateral epitaxial solid phase regrowth vertically to form a thin film defining the first source/drain region and the second source/drain region of a transistor;
forming a gate insulator n the thin film; and
forming a gate structure relative to the thin film.

2. A method in accordance with claim 1 wherein providing a substrate comprises providing a lightly doped p-type substrate.

3. A method in accordance with claim 1 wherein providing a substrate comprises providing a silicon on insulator substrate.

4. A method in accordance with claim 1 wherein providing a substrate comprises providing islands of silicon on insulator.

5. A method in accordance with claim 1 wherein forming a gate structure comprises forming a horizontal gate structure.

6. A method in accordance with claim 1 wherein forming a gate structure comprises forming a horizontal replacement gate structure.

7. A method in accordance with claim 1 wherein forming a gate structure comprises forming a vertical gate structure.

8. A method of forming a logic gate array comprising:
providing a substrate having a generally planar working surface;
forming a plurality of pillars of semiconductor material extending outwardly from a working surface of the substrate, the pillar having a plurality of sides; and
forming a plurality of vertical transistors having first and second source/drain regions formed within one of the pillar and having a gate associated with a side of that pillar, wherein one of the vertical transistors is a PMOS transistor and another of the transistors is an NMOS transistor.

9. A method of forming a logic gate array comprising:
providing a substrate having a generally planar working surface;
oxidizing the substrate;
forming a pillar of semiconductor material extending outwardly from the working surface of the substrate, the pillar having a plurality of sidewalls;
depositing polysilicon over the pillar;
heating to cause lateral pitaxial solid phase regrowth vertically to form thin film defining the first source/drain region and the second source/drain region of a transistor;
forming a gate insulator on the thin film; and
forming a horizontal gate structure relative to the thin film.

10. A method off forming a logic gate array comprising:
providing a substrate having a generally planar working surface;
oxidizing the substrate;
forming a pillar of semiconductor material extending outwardly from the working surface of the substrate, the pillar having a plurality of sidewalls;
depositing polysilicon over the pillar;
heating to cause lateral epitaxial solid phase regrowth vertically to form thin film defining the first source/drain region and the second source/drain region of a transistor;
forming a gate insulator on the thin film; and
forming a horizontal replacement gate structure relative to the thin film.

11. A method of forming a logic gate array comprising:
providing a substrate having a generally planar working surface;
oxidizing the substrate;
forming a pillar of semiconductor material extending outwardly from the working surface of the substrate, the pillar having a plurality of sidewalls;
depositing polysilicon over the pillar;
forming first source/drain region and the second source/drain region of a transistor along a thin film formed on the pillar; and
forming a gate insulator on the thin film.

* * * * *

UNITED STATES PATENT AND TRADEMARK OFFICE
CERTIFICATE OF CORRECTION

PATENT NO. : 6,649,476 B2
DATED : November 18, 2003
INVENTOR(S) : Leonard Forbes It is certified that error appears in the above-identified patent and that said Letters Patent is hereby corrected as shown below:

Column 3,
Line 17, replace "with either switch from 1 to 0 or remain at the precharged" with -- will either switch from 1 to 0 or remain at the precharged --

Column 8,
Line 58, replace "forming a gate insulator n the thin film, and" with -- forming a gate insulator on the thin film, and --

Signed and Sealed this

Twentieth Day of July, 2004

JON W. DUDAS
*Acting Director of the United States Patent and Trademark Office*